(12) United States Patent
Ko et al.

(10) Patent No.: US 11,268,209 B2
(45) Date of Patent: Mar. 8, 2022

(54) SEED CRYSTAL INCLUDING PROTECTIVE FILM INCLUDING A FIRST LAYER WITH FIRST FILLER AND SECOND LAYER WITH SECOND FILLER

(71) Applicant: SENIC INC., Seoul (KR)

(72) Inventors: Sang Ki Ko, Suwon-si (KR); Jung-Gyu Kim, Suwon-si (KR); Jung Woo Choi, Suwon-si (KR); Byung Kyu Jang, Suwon-si (KR); Kap-Ryeol Ku, Suwon-si (KR)

(73) Assignee: SENIC INC., Seoul (KR)

( * ) Notice: Subject to any disclaimer, the term of this patent is extended or adjusted under 35 U.S.C. 154(b) by 34 days.

(21) Appl. No.: 16/658,436

(22) Filed: Oct. 21, 2019

(65) Prior Publication Data

US 2020/0123678 A1 Apr. 23, 2020

(30) Foreign Application Priority Data

Oct. 22, 2018 (KR) .................. 10-2018-0125843
Dec. 13, 2018 (KR) .................. 10-2018-0160650

(51) Int. Cl.
*C30B 29/36* (2006.01)
*C30B 23/02* (2006.01)
*C30B 35/00* (2006.01)

(52) U.S. Cl.
CPC .............. *C30B 29/36* (2013.01); *C30B 23/02* (2013.01); *C30B 35/007* (2013.01)

(58) Field of Classification Search
CPC ....... C30B 23/00; C30B 23/02; C30B 23/025; C30B 29/00; C30B 29/10; C30B 29/36; C30B 35/00; C30B 35/007
(Continued)

(56) References Cited

U.S. PATENT DOCUMENTS

2006/0225645 A1* 10/2006 Powell .................... C30B 23/00
117/105
2012/0006255 A1* 1/2012 Nishiguchi ............. C30B 29/36
117/106

(Continued)

FOREIGN PATENT DOCUMENTS

CN 108118389 A 6/2018
CN 110168147 A 8/2019
(Continued)

*Primary Examiner* — Kenneth A Bratland, Jr.
(74) *Attorney, Agent, or Firm* — NSIP Law

(57) ABSTRACT

A method for preparing a seed crystal including a protective film includes preparing i) a first layer composition of a first binder resin and a first solvent and ii) a second layer composition of a second binder resin, a filler, and a second solvent, applying the first layer composition to the rear surface of a seed crystal to form a first coating layer on the rear surface of the seed crystal and drying the first coating layer to form a first layer on the rear surface of the seed crystal, and applying the second layer composition onto the first layer to form a second coating layer on the first layer, followed by heat treating to form a second layer on the first layer wherein the first layer and the second layer are sequentially disposed on the rear surface of the seed crystal, and wherein the first layer has a thickness corresponding to 30% or less of the distance from the bottom surface of the first layer to the top surface of the second layer.

12 Claims, 9 Drawing Sheets

(58) Field of Classification Search
USPC .......... 117/84, 105–106, 200, 204, 937, 951
See application file for complete search history.

(56) References Cited

U.S. PATENT DOCUMENTS

2015/0068446 A1* 3/2015 Drachev .............. C30B 23/025
                                                        117/84
2018/0251909 A1* 9/2018 Nakabayashi .......... C30B 29/36

FOREIGN PATENT DOCUMENTS

| EP | 3 561 158 A2 | 10/2019 | |
| JP | 2001-114599 A | 4/2001 | |
| JP | 2011-6302 A | 1/2011 | |
| JP | 2011-219337 A | 11/2011 | |
| JP | 2016-534973 A | 11/2016 | |
| KR | 10-0675912 B1 | 2/2007 | |
| KR | 10-2012-0022791 A | 3/2012 | |
| KR | 10-2014-0110266 A | 9/2014 | |
| KR | 10-1553387 B1 | 9/2015 | |
| KR | 10-1713006 B1 | 3/2017 | |
| KR | 10-1744287 B1 | 6/2017 | |
| KR | 10-1809642 B1 | 12/2017 | |
| WO | WO 2011/065239 A1 | 6/2011 | |
| WO | WO 2011/065239 A9 | 6/2011 | |
| WO | WO-2016152813 A1 * | 9/2016 | .......... C30B 23/002 |
| WO | WO 2018/117645 A2 | 6/2018 | |

* cited by examiner (a)

(b)

SEED CRYSTAL INCLUDING PROTECTIVE FILM INCLUDING A FIRST LAYER WITH FIRST FILLER AND SECOND LAYER WITH SECOND FILLER

CROSS-REFERENCE TO RELATED APPLICATIONS

This application claims the benefit under 35 USC 119(a) of Korean Patent Application No. 10-2018-0125843 filed on Oct. 22, 2018, and Korean Patent Application No. 10-2018-0160650 filed on Dec. 13, 2018, in the Korean Intellectual Property Office, the entire disclosures of which are incorporated herein by reference for all purposes.

BACKGROUND

1. Field

The present disclosure relates to a method for preparing a seed crystal including a protective film that can be used to produce a silicon carbide ingot with fewer defects and less warpage, a method for producing an ingot using a seed crystal prepared by the preparation method, and a method for attaching a seed crystal to a seed crystal holder through a protective layer and an adhesive layer formed on one surface of the seed crystal.

2. Description of the Background

Substrate materials such as gallium nitride (GaN), aluminum nitride (AlN), and silicon carbide (SiC) are used in the fabrication of high-voltage, high-power optoelectronic devices. Among these substrate materials, silicon carbide (SiC) is receiving more attention than sapphire and silicon.

Single-crystal silicon carbide (SiC) has a large energy band gap and its break field voltage and thermal conductivity are higher than those of silicon (Si). Due to these characteristics, single-crystal silicon carbide is expected to be applicable to semiconductor devices where high efficiency, high breakdown voltage, and large capacity are needed.

Silicon carbide can be grown by suitable processes, such as liquid phase epitaxy (LPE), seeded sublimation, and chemical vapor deposition (CVD). Particularly, seeded sublimation is the most widely used process for the preparation of silicon carbide in the form of an ingot at high growth rate. Seeded sublimation is also referred to as physical vapor transport (PVT).

Methods for producing single crystals may include a method for growing a single-crystal ingot on a seed crystal by heating with a heater in a vacuum container (furnace) into which argon gas can be introduced while maintaining the temperature of the seed crystal at a temperature lower by 10 to 100° C. than the temperature of a raw material powder.

Generally, the gluing of a seed crystal is a prerequisite for the growth of a single-crystal ingot. However, discrete defects such as macroscopic channels or voids are formed in some areas where a seed crystal is incompletely attached to a seed crystal holder. These defects make it difficult to produce a high-quality silicon carbide single crystal.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for preparing a seed crystal having a protective film includes the steps of preparing i) a first layer composition of a first binder resin and a first solvent and ii) a second layer composition of a second binder resin, a filler, and a second solvent, applying the first layer composition to the rear surface of a seed crystal to form a first coating layer on the rear surface of the seed crystal and drying the first coating layer to form a first layer on the rear surface of the seed crystal, and applying the second layer composition onto the first layer to form a second coating layer on the first layer, followed by heat treating to form a second layer on the first layer, wherein the first layer and the second layer are sequentially disposed on the rear surface of the seed crystal, and wherein the first layer has a thickness corresponding to 30% or less of the distance from the bottom surface of the first layer to the top surface of the second layer.

The first layer composition may include 1 part by weight or less of a carbonaceous or metallic filler, in terms of the solid content, based on 100 parts by weight of the first binder resin.

The second layer composition may include 20 to 300 parts by weight of the filler, in terms of the solid content, based on 100 parts by weight of the second binder resin.

The first layer may have a thickness of 20 µm or less.

The first layer may include a carbonized first carbonaceous layer and the second layer may include a carbonized second carbonaceous layer.

The protective film may further include one or more additional layers formed on the second layer.

A method for producing an ingot may include loading a raw material into an internal space of a reactor and locating the seed crystal comprising a protective film above the raw material, and growing a silicon carbide crystal on the front surface of the seed crystal to produce an ingot.

The reactor may further include a rack located on an inner wall of a reactor body or at an opening of the reactor body and the seed crystal may be positionally fixed by the rack.

The ingot may include a warpage of 500 µm or less, as evaluated by a difference in thicknesses of the ingot from rear surface to front surface of the ingot at a center and an edge of the ingot.

The front surface of the silicon carbide seed crystal may be a C-plane (000-1).

The seed crystal may have a diameter of 4 inches or more.

In another general aspect, a seed crystal having a protective film includes a silicon carbide seed crystal having a front surface and a rear surface, and a protective film located on the rear surface of the silicon carbide seed crystal, wherein the protective film includes a first layer in direct contact with the rear surface of the silicon carbide seed crystal and a second layer located on the first layer, and wherein the first layer has a thickness corresponding to 30% or less of the thickness of the protective film from the bottom surface of the first layer to the top surface of the second layer.

The second layer composition may include a greater amount of a filler than the first layer composition.

The seed crystal may further include a silicon carbide ingot located on the front surface of the silicon carbide seed crystal and having a warpage of 500 μm or less.

The seed crystal may further include a silicon carbide ingot located on the front surface of the silicon carbide seed crystal and having a micropipe defect density of $1/cm^2$ or less.

In another general aspect, a method for attaching a seed crystal includes the steps of (a) forming a protective layer on one surface of a seed crystal, (b) forming an adhesive layer on the protective layer, and (c) attaching the seed crystal to a seed crystal holder through the protective layer and the adhesive layer, wherein the step (a) includes substeps of (a-1) preparing a protective layer composition including a binder resin and a filler, (a-2) applying the protective layer composition to the one surface of the seed crystal, and (a-3) heat treating the protective layer composition.

The heat treating (a-3) may include drying, curing, and carbonizing or graphitizing the protective layer composition.

The method may further include a step of patterning the lower surface of the seed crystal holder prior to the step (c) wherein the patterned seed crystal holder may have a surface roughness (Ra) of about 0.5 mm to about 3 mm.

The lower surface of the seed crystal holder may be patterned after the step (b).

The protective layer may have a greater density than the adhesive layer.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
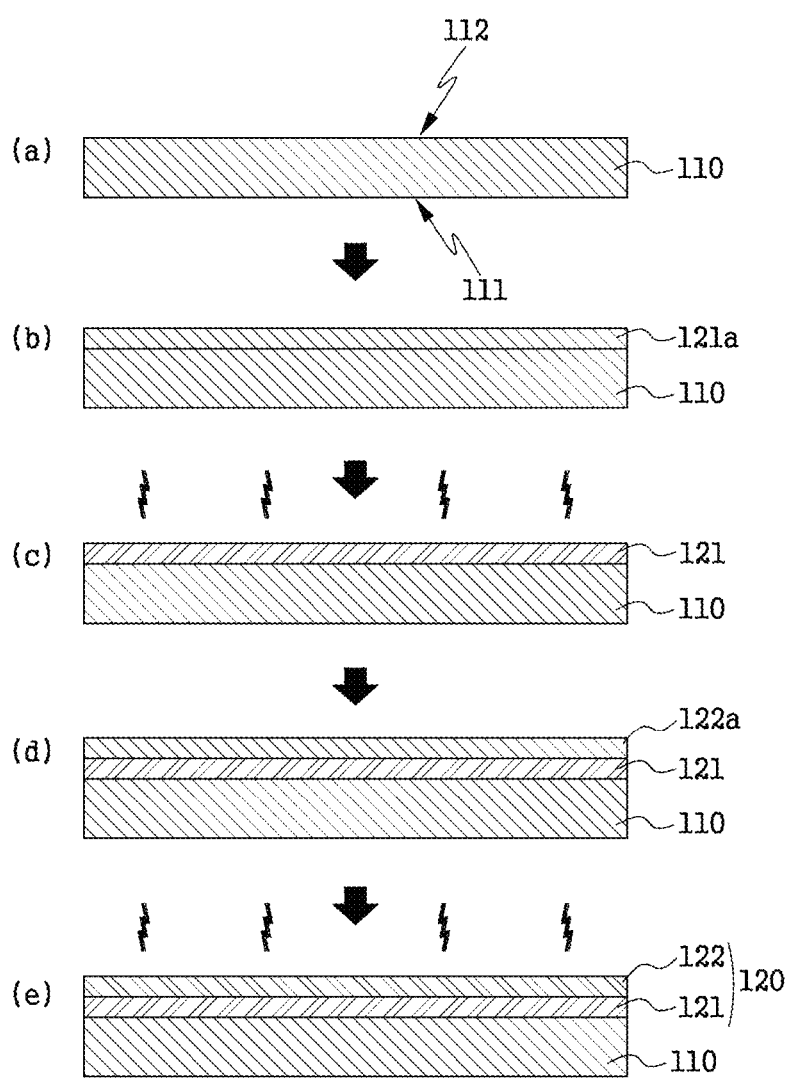
FIG. 1 is a conceptual view illustrating a process for forming a protective film on the rear surface of a seed crystal according to example embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

In example embodiments, the term "combination of" included in Markush type description means mixture or combination of one or more elements described in Markush type and thereby means that the disclosure includes one or more elements selected from the Markush group.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

In example embodiments, the term "~-based compound" is intended to include compounds corresponding to "~" or derivatives of "~".

As used herein, the terms "about", "substantially", etc. are intended to allow some leeway in mathematical exactness to account for tolerances that are acceptable in the trade and to prevent any unconscientious violator from unduly taking advantage of the disclosure in which exact or absolute numerical values are given so as to help understand the application. Due to manufacturing techniques and/or tolerances, variations of the shapes shown in the drawings may occur. Thus, the examples described herein are not limited to the specific shapes shown in the drawings, but include changes in shape that occur during manufacturing.

As used herein, the term "and/or" includes any one and any combination of any two or more of the associated listed items; likewise, "at least one of" includes any one and any combination of any two or more of the associated listed items.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

One object of example embodiments is to provide a method for preparing a seed crystal including a protective film that can be used to produce a silicon carbide ingot with fewer defects and less warpage.

A further object of example embodiments is to provide a method for producing a silicon carbide ingot with fewer defects and less warpage.

Another object of example embodiments is to provide a SiC single-crystal ingot that is produced using a seed crystal including a protective layer and an adhesive layer formed on one surface thereof and attached to a seed crystal holder, achieving rapid and stable growth and improved quality of the ingot.

In example embodiments, the term "front surface" of a seed crystal generally refers to a wide, flat surface of the seed crystal on which a single-crystal ingot grows and the term "rear surface" refers to a surface of the seed crystal opposite to the surface on which a single-crystal ingot grows.

In example embodiments, a first layer mentioned in the description of a protective film refers to a layer in which a filler is not substantially used or is present in a very small amount and which is in direct contact with the rear surface of a seed crystal. In example embodiments, a second layer refers to a layer which is formed on the first layer and in which a filler is used.

FIG. 1 is a conceptual view illustrating a process for forming a protective film on the rear surface of a seed crystal according to example embodiments. Example embodiments will be described in more detail with reference to FIG. 1.

A method for preparing a seed crystal including a protective film according to example embodiments includes the steps of preparing a first layer composition and a second layer composition, forming a first layer, and forming a second layer.

In a seed crystal including a protective film prepared by the method, the first layer has a thickness corresponding to 30% or less of the thickness of the protective film from the bottom surface of the first layer to the top surface of the second layer.

According to the method for preparing a seed crystal, the first layer composition has a lower solid content than the second layer composition.

The first layer composition includes a first binder resin and may further include a first solvent. The second layer composition includes a second binder resin and a filler and may further include a second solvent.

A resin having a high actual carbon ratio may be used as the first binder resin. For example, the first binder resin may have an actual carbon ratio of about 5 to about 50% by weight or 10 to 30% by weight, as measured in an inert atmosphere. For example, the first binder resin may be a phenolic resin, a polyacrylonitrile resin, a pitch resin, a polyvinyl chloride resin, a polyacrylic resin, a furan resin, an epoxy resin or a mixture thereof.

Any solvent that can help disperse the first binder resin and form a first coating layer may be used as the first solvent. The first coating layer refers to a layer that can become the first layer by a process described below. For example, ethanol, methanol, acetone, dimethylformamide (DMF) or dimethyl sulfoxide (DMSO) can be used as the first solvent.

The first layer composition may include a smaller amount of a filler than the second layer composition.

The first layer composition may include 1 part by weight or less of a carbonaceous or metallic filler, in terms of the solid content, based on 100 parts by weight of the first binder resin.

The first layer composition may include 0.1 parts by weight or less of a carbonaceous or metallic filler, in terms of the solid content, based on 100 parts by weight of the first binder resin. The first layer composition may be substantially free of a carbonaceous or metallic filler, in terms of the solid content, based on 100 parts by weight of the first binder resin.

The first layer composition may be substantially free of a filler.

When the first layer composition includes only a very small amount of a carbonaceous or metallic filler or is substantially free of a filler, thermal shrinkage is minimized, which is intended by example embodiments, and as a result, a first layer with controlled stress can be formed.

The first layer composition may include about 5 to about 99% by weight, for example, 10 to 95% by weight or 85 to 94% by weight of the first binder resin.

The first layer composition may include about 5 to about 30% by weight, for example, 5 to 20% by weight or 1 to 15% by weight of the first binder resin in terms of the solid content.

The presence of the first binder resin in the amount or the solid content defined above ensures good coatability of the first layer composition and enables the formation of a layer with minimal thermal shrinkage.

The second binder resin and the filler are dispersed in the second layer composition to form a second coating layer. The second layer composition may further include a second solvent. The second coating layer becomes the second layer by a process described below.

The second binder resin is substantially the same as the first binder resin and a further detailed description thereof is thus omitted to avoid duplication. The second binder resin may be the same as the first binder resin.

The second solvent is substantially the same as the first solvent and a further detailed description thereof is thus omitted to avoid duplication. The second solvent may be the same as the first solvent.

The filler may be a carbonaceous filler, a metallic filler or a combination thereof. For example, the filler may be a carbonaceous filler selected from the group consisting of crystalline graphite, amorphous graphite, expandable graphite, carbon black, carbon nanotubes, graphene, and combinations thereof. The filler may be a metallic filler selected from the group consisting of tantalum (Ta), tungsten (W), rhenium (Re), molybdenum (Mo), hafnium (Hf), tantalum carbide (TaC), tungsten carbide (WC), and combinations thereof.

The presence of the filler in the composition promotes carbonization of the composition and prevents excessive shrinkage to minimize the formation of cracks during heat treating after coating of the composition.

The second layer composition may include about 20 to about 300 parts by weight, for example, 40 to 200 parts by weight of the filler, in terms of the solid content, based on 100 parts by weight of the second binder resin.

The filler may be present in an amount of about 5 to about 40% by weight, for example, 10 to 30% by weight or 15 to 25% by weight, based on the total weight of the second layer composition.

Due to the presence of the second binder resin and the filler within the respective ranges defined above, good coatability of the second layer composition is ensured and the occurrence of thermal shrinkage and cracks after heat treating can be minimized.

The first layer composition and/or the second layer composition may optionally further include one or more additives in addition to the aforementioned components. For example, the additives may be typical wetting dispersants and defoamers.

In the step of forming a first layer, the first layer composition is applied to the rear surface of a seed crystal to form a first layer on the rear surface of the seed crystal.

The step of forming a first layer includes the substeps of applying the first layer composition to the rear surface 112 of a seed crystal 110 to form a first coating layer 121a on the rear surface of the seed crystal and drying the first coating layer 121a to form a first layer 121 on the rear surface 112 of the seed crystal 110.

The seed crystal 110 may be one that can be used for ingot growth. For example, the seed crystal 110 may be a silicon carbide seed crystal.

The kind of the seed crystal 110 may vary depending on the type of a crystal to be grown. For example, the seed crystal may be, for example, a 4H-SiC, 6H-SiC, 3C-SiC and/or 15R-SiC wafer but is not limited thereto. The seed crystal may be a single-crystal silicon carbide wafer.

The seed crystal 110 has a front surface 111 and a rear surface 112.

The front surface 111 of the seed crystal may be a C-plane (000-1). In this case, a silicon carbide ingot with fewer defects can be produced.

The first layer 121 may be formed in direct contact with the rear surface 112 of the seed crystal.

The seed crystal 110 may be pre-cleaned before formation of the first coating layer 121a on the rear surface 112. The cleaning may be performed simultaneously with the preparation step or before the first layer formation step.

The cleaning may be performed by cleaning the surface of the seed crystal including the rear surface 112 with a cleaning fluid. The cleaning fluid may be acetone, alcohol, distilled water, an acid solution or a combination thereof. The cleaning may be performed by sonication or immersion, which can be repeated one or more times.

The cleaning enables the removal of a silicon dioxide film that may be formed as a result of the reaction of silicon with oxygen on the surface of the seed crystal. The use of the cleaned seed crystal enables the growth of an ingot with fewer defects.

The first layer 121 is formed from the first coating layer 121a formed using the first layer composition. The first layer 121 is formed by coating the first layer composition on the rear surface 112. Any coating technique may be used without particular limitation to coat the first layer composition. For example, the first layer composition may be coated by a general coating technique such as spin coating or tape casting.

The first coating layer 121a may have a thickness of about 20 microns (μm) or less, for example, 1 to 15 μm or 2 to 13 μm. When the thickness of the first coating layer is as defined above, the first layer 121 can be effectively formed to a desired thickness after drying. The thickness of the first layer 121 will be described below.

The first coating layer 121a can be dried and optionally cured to form the first layer 121 as a first film layer.

The first layer may be a first carbonaceous layer formed by carbonization of the first film layer.

The drying may be performed at a temperature of about 100 to about 350° C.

The first layer 121 may have a thickness of 15 μm or less, for example, 1 to 10 μm or 1.5 to 8 μm. When the thickness of the first layer 121 is as defined above, the first layer 121, together with a second layer 122 to be formed in the subsequent step, can prevent loss of the rear surface of the seed crystal 110 and reduce warpage of a final ingot while minimizing possible thermal shrinkage during growth of the ingot.

In the step of forming a second layer, the second layer composition is applied onto the first layer to form a second layer on the first layer. The first layer and the second layer constitute the protective film of the seed crystal.

The step of forming a second layer includes the substeps of applying the second layer composition onto the first layer 121 to form a second coating layer 122a and heat treating the second coating layer 122a to prepare a seed crystal in which the first layer 121 and the second layer 122 are sequentially located on the rear surface 112 of the seed crystal.

The second layer 122 is formed from the second coating layer formed using the second layer composition. The second layer 122 is formed by coating the second layer composition on the first layer 121. Any coating technique may be used without particular limitation to coat the second layer composition. For example, the second layer composition may be coated by a general coating technique such as spin coating or tape casting.

The second coating layer 122a may have a thickness of 50 µm or less, for example, 5 to 40 µm. When the thickness of the second coating layer is as defined above, the second layer 122 can be effectively formed to a desired thickness after drying. The thickness of the second layer 122 will be described below.

The second coating layer 122a can be heat treated to form the second layer 122.

The second coating layer 122a can be dried and optionally cured to form the second layer 122 as a second film layer.

The second layer may be a second carbonaceous layer formed by carbonization of the second film layer.

The heat treating may be performed at a temperature of about 100 to about 350° C. for about 0.5 to about 10 hours. The heat treating may be performed at a heating rate of about 3 to about 20° C./min, for example, 5 to 15° C./min to the heat treating temperature. The heating rate ensures effective carbonization (or graphitization) of the second coating layer while minimizing the occurrence of thermal shrinkage stress.

The heat treating may be performed in an inert gas atmosphere. The inert gas may be, for example, argon gas or nitrogen gas.

The heat treating may be performed by induction heating or resistance heating. That is, the heat treating may be performed in an induction heating furnace or a resistance heating furnace.

The second layer 122 may include amorphous carbon or crystalline carbon (for example, graphitized carbon). That is, the second layer 122 may include carbonization or graphitization products of the binder resin and the filler.

The second layer 122 may have a thickness of 50 µm or less, for example, 5 to 25 µm. The second layer 122 having the thickness defined above can prevent loss of the rear surface of the seed crystal and reduce the formation of ingot defects while minimizing possible thermal shrinkage during subsequent ingot growth.

The protective film may further include one or more additional layers on the second layer. The number of the additional layers may be from 1 to 8.

The method may further include the step of forming a third layer after the second layer formation step.

The step of forming a third layer may include the substeps of applying a third layer composition including a third binder resin, a filler, and a third solvent onto the second layer to form a third coating layer and heat treating the third coating layer to prepare a seed crystal in which the first layer, the second layer, and the third layer are sequentially located on the rear surface of the seed crystal.

The third binder resin is substantially the same as the first binder resin and a further detailed description thereof is thus omitted to avoid duplication. The third binder resin may be the same as the first binder resin.

The third solvent is substantially the same as the first solvent and a further detailed description thereof is thus omitted to avoid duplication. The third solvent may be the same as the first solvent.

The filler is substantially the same as the filler mentioned in the description of the second layer composition. The filler of the third layer composition may be the same as the filler of the second layer composition.

The presence of the filler in the composition promotes carbonization of the composition and prevents excessive shrinkage to minimize the formation of cracks during heat treating after coating of the composition.

The third layer composition may include about 20 to about 300 parts by weight, for example, 40 to 200 parts by weight of the filler, in terms of the solid content, based on 100 parts by weight of the third binder resin. The filler may be present in an amount of about 5 to about 40% by weight, for example, 10 to 30% by weight or 15 to 25% by weight, based on the total weight of the third layer composition. Due to the presence of the third binder resin and the filler within the respective ranges defined above, good coatability of the third layer composition is ensured and the occurrence of thermal shrinkage and cracks after heat treating can be minimized.

The third layer composition may optionally further include one or more additives in addition to the aforementioned components, as described above for the first layer composition and the second layer composition. Examples of the additives include wetting dispersants and defoamers.

The third layer (not illustrated) is formed from the third coating layer (not illustrated) formed using the third layer composition. The third layer is formed by coating the third layer composition on the second layer 122. Any coating technique may be used without particular limitation to coat the third layer composition. For example, the third layer composition may be coated by a general coating technique such as spin coating or tape casting.

The third coating layer may have a thickness of 50 µm or less, for example, 5 to 40 µm. When the thickness of the third coating layer is as defined above, the third layer can be effectively formed to a desired thickness after drying. The thickness of the third layer will be described below.

The third layer (not illustrated) may be formed from the third coating layer by heat treating.

The third coating layer can be dried and optionally cured to form the third layer (not illustrated) as a third film layer.

The third film layer may be carbonized to form a third carbonaceous layer.

The heat treating may be performed at a temperature of about 100 to about 350° C. for about 0.5 to about 10 hours. The heat treating may be performed at a heating rate of about 3 to about 20° C./min, for example, 5 to 15° C./min to the heat treating temperature. The heating rate ensures effective carbonization (or graphitization) of the third coating layer while minimizing the occurrence of thermal shrinkage stress.

The heat treating may be performed in an inert gas atmosphere. The inert gas may be, for example, argon gas or nitrogen gas.

The heat treating may be performed by induction heating or resistance heating. That is, the heat treating may be performed in an induction heating furnace or a resistance heating furnace.

The third layer may include amorphous carbon or crystalline carbon (for example, graphitized carbon). That is, the third layer may include carbonization or graphitization products of the binder resin and the filler.

The third layer may have a thickness of 50 µm or less, for example, 5 to 25 µm. The third layer having the thickness defined above can prevent loss of the rear surface of the seed crystal and reduce the formation of ingot defects while minimizing possible thermal shrinkage during subsequent ingot growth.

One or more additional layers may be formed in the same manner as the second layer or the third layer.

The first layer 121 may have a thickness corresponding to 30% or less of the thickness of the protective film from the bottom surface of the first layer 121 to the top surface of the second layer 122. For example, the thickness of the first layer 121 may correspond to 1 to 30% of the thickness of the protective film from the bottom surface of the first layer 121 to the top surface of the second layer 122. For example, the thickness of the first layer 121 may correspond to 5 to 25% of the thickness of the protective film from the bottom surface of the first layer 121 to the top surface of the second layer 122.

The presence of the first layer 121, whose thickness is in the range defined above, and the second layer 122 reduces the number of defects, particularly the occurrence of warpage of a final ingot grown from the seed crystal 110.

The features of example embodiments are thought to be due to the combined effect of the role of the first layer 121, which is formed to a relatively small thickness without substantially using a filler to effectively reduce thermal shrinkage, and the role of the second layer 122 formed on the first layer 121.

The first layer 121 may have a thickness corresponding to 30% or less, for example, 1 to 30% or 5 to 24% of the total thickness of the protective film 120.

Due to its features, the first layer 121 combined with the second layer 122 and optionally other layers can be used to produce an ingot in which the occurrence of stress resulting from thermal shrinkage and the formation of defects such as warpage are reduced.

Figure 2:
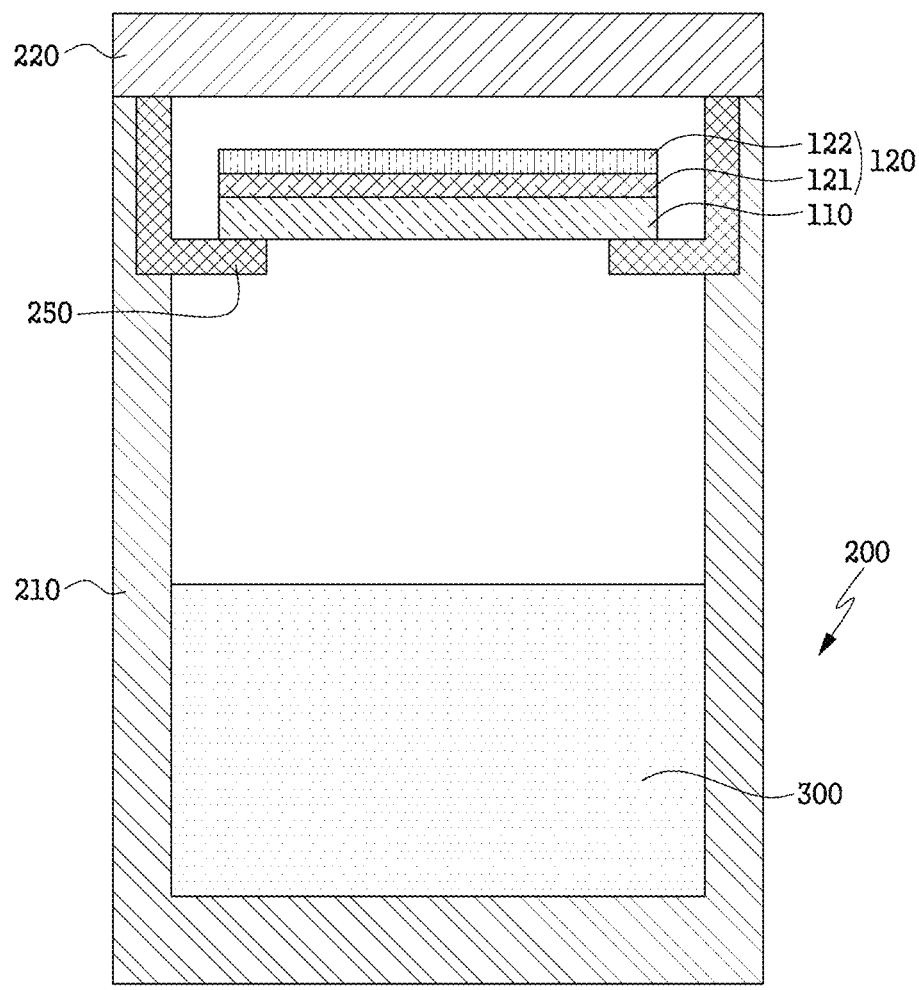
FIGS. 2 and 3 are conceptual views illustrating the structures of reactors (crucibles) for the growth of single-crystal ingots according to example embodiments.
Figure 3:
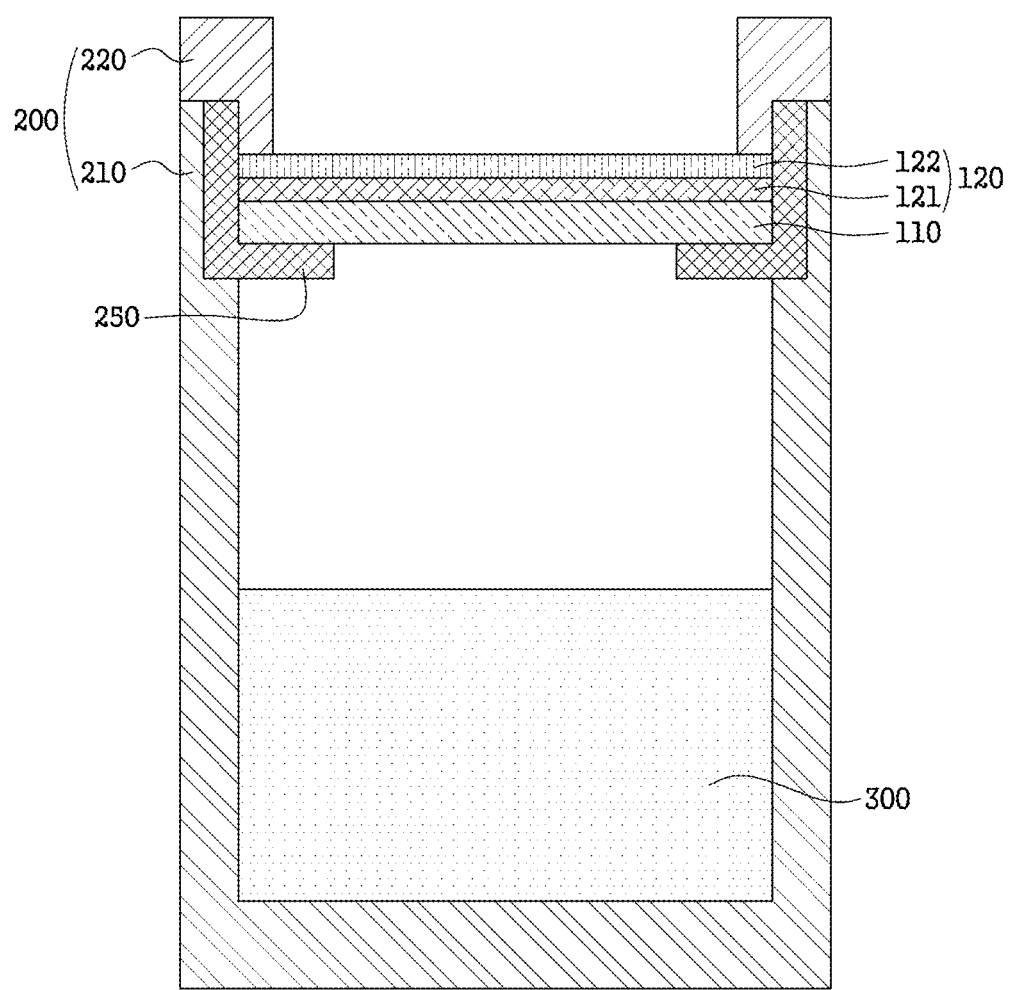
Figure 4:
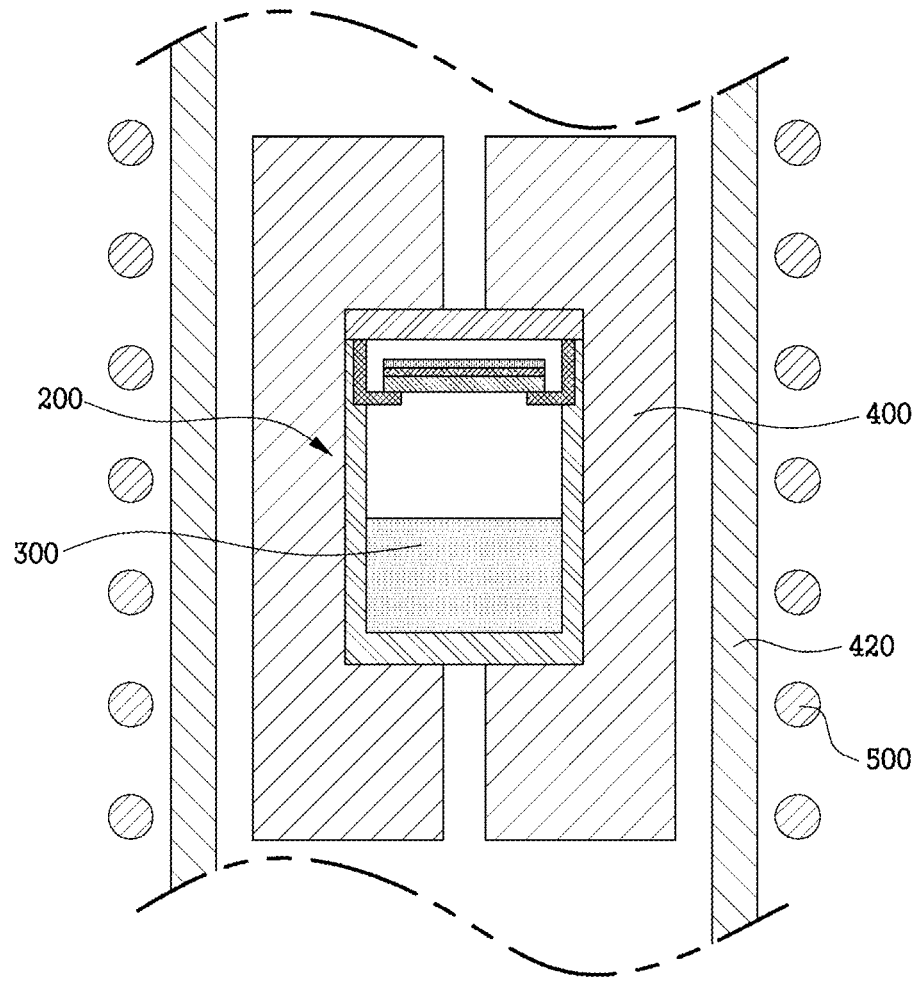
FIG. 4 is a conceptual view illustrating the structure of a reaction chamber in which the crucible of FIG. 2 is placed according to example embodiments.

FIGS. 2 and 3 are conceptual views illustrating the structures of reactors (crucibles) for the growth of single-crystal ingots. FIG. 4 is a conceptual view illustrating the structure of a reaction chamber in which the crucible of FIG. 2 is placed.

One or more examples of a method for producing an ingot will be described in more detail with reference to FIGS. 1 to 4. A method for producing an ingot according to example embodiments includes the steps of loading a raw material 300 into an internal space of a reactor 200 and locating a seed crystal 110 including a protective film 120 above the raw material 300 (arrangement step), and growing a silicon carbide crystal on the front surface 111 of the seed crystal to produce an ingot (not illustrated) (recrystallization step), wherein the seed crystal including a protective film 120 is prepared according to one embodiment of the preparation method of example embodiments.

The reactor may further include a rack 250 located on an inner wall of a body 210 of the reactor or at an opening of the body 210 of the reactor. The rack 250 may be in direct contact with a portion of the seed crystal 110 to fix the seed crystal 110 to the reactor 200.

In the arrangement step, the seed crystal 110 is arranged in the reactor 200 such that the protective film 120 is located on the rear surface 112 of the seed crystal and the raw material 300 is located below the front surface 111 of the seed crystal.

The seed crystal 110 may be fixed to the reactor 200 by bringing the rack 250 into direct contact with the seed crystal 110 without substantially using an adhesive at the contact portion between the seed crystal 110 and the rack 250. That is, the seed crystal may be arranged such that a portion of the front surface of the seed crystal 110 is in direct contact with a portion or the entirety of the rack 250 in the recrystallization step.

When the seed crystal 110 is positionally fixed to the reactor 200 through the rack 250, there is no need to form an adhesive layer between the seed crystal and the rack and thermal stress arising from the formation of an adhesive layer during ingot growth is completely suppressed, enabling the production of a single-crystal ingot with few defects, unlike when a seed crystal is fixedly attached to a conventional seed crystal holder.

The rack 250 cross-section may be in the shape of an "L" (see FIG. 2) and a reactor cover 220 may be located on the rack 250.

The rack 250, optionally together with the reactor cover 220, surrounds at least a portion of the side surface, a portion of the bottom surface, and a portion of the upper surface of the seed crystal including the protective film 120 (see FIG. 3). In this case, the rack 250 cross-section may be in the shape of a "C".

The reactor 200 may be a crucible and may be made of a material having a melting point equal to or higher than the sublimation temperature of SiC. For example, the reactor 200 may be composed of a carbonaceous component, for example a graphite component, and may be a graphite crucible. The rack 250 and the reactor 200 may be made of the same or different carbonaceous components.

The underlying raw material 300 may be silicon carbide (SiC), for example, in the form of a powder. Any material that can be evaporated and grown into a single-crystal ingot on the seed crystal 110 in the recrystallization step may be used as the raw material 300.

The recrystallization step can be carried out after the reactor 200 is surrounded by a heat insulating material 400 and put into a reaction chamber (for example, a quartz tube) 420) provided with heating means.

The heating means 500 may be, for example, an induction heating coil or resistance heater but is not limited thereto.

In the recrystallization step, the raw material is crystallized on the front surface of the seed crystal and the crystal is grown into a silicon carbide ingot. For example, the recrystallization step may be carried out by sublimating the raw material, recrystallizing the sublimated raw material on the front surface of the seed crystal, and growing the crystal into an ingot.

While not wishing to be bound by theory the recrystallization step may be based on the principle in which a raw material is sublimated into a gas at high temperature and the gas is then allowed to grow into a single-crystal ingot on a seed crystal under reduced pressure. Therefore, the recrystallization step may be carried out under recrystallization temperature and pressure conditions.

For example, the recrystallization step can be carried out at a temperature of about 1800 to about 2500° C., for example, 2100 to 2400° C. and a pressure of about 1 to about 200 torr, for example, 1 to 150 torr. For example, the recrystallization step may be carried out at a temperature of 2200 to 2300° C. or 2250 to 2300° C. and a pressure of 1 to 100 torr or 1 to 50 torr.

When the reactor 200 is heated to a temperature for ingot growth in the recrystallization step, the seed crystal 110 arranged in the reactor 200 is also heated. At this time, the seed crystal 110 may be partially lost by sublimation. That is, SiC gas sublimated from the raw material is continuously supplied to the front surface (growth surface) of the seed crystal 110 to allow for the growth of a single crystal. However, since the rear surface of the seed crystal is exposed to heat, the seed crystal may be partially sublimated under the influence of heat, leading to the formation of defects in a final ingot. In example embodiments, the carbonaceous protective film may have a bi- or multilayer structure formed on the rear surface of the seed crystal, as described above. This structure protects the rear surface of the seed crystal from loss to substantially prevent the formation of defects in a final ingot. The formation of both the first and second layers minimizes the occurrence of thermal stress, enabling the production of an ingot with reduced warpage.

For example, the silicon carbide ingot may have a warpage of 500 μm or less, 400 μm or less, or 1 to 200 μm. For example, the silicon carbide ingot grown from the seed crystal having a diameter of 4 inches or more at a temperature of 2300° C. and a pressure of 20 torr for 100 hours may have a warpage of 130 μm or less, 1 to 120 μm or 1 to 100 μm. The warpage is defined as the difference between the heights of the grown silicon carbide ingot from the rear surface of the ingot to the front surface at the center and the edge of the ingot. The warpage of the silicon carbide ingot is considerably low despite its large area, indicating that the method of example embodiments enables the production of a silicon carbide ingot with fewer defects and less warpage.

The silicon carbide ingot may have a micropipe defect density of $1/cm^2$ or less, indicating that the silicon carbide ingot is substantially free of defects and has high quality.

According to example embodiments, the constituent layers of the multilayer protective film formed on the seed crystal are designed to have different physical properties. Due to this design, the multilayer protective film has improved physical properties in terms of quality, adhesion to the seed crystal, and thickness compared to a monolayer protective film. Therefore, possible stress during growth of the single-crystal ingot is more effectively suppressed so that the quality of the ingot can be prevented from deterioration resulting from defects, for example, cracks.

In example embodiments, the silicon carbide single-crystal ingot can be produced over a large area in an efficient manner because the seed crystal does not need to be attached to a seed crystal holder.

For example, the silicon carbide single-crystal ingot may have a diameter of 2 inches or more, 3 inches or more, 4 inches or more, 5 inches or more, or even 6 inches or more. For example, the silicon carbide single-crystal ingot may have a diameter of 2 to 10 inches, 2 to 8 inches, 4 to 8 inches or 4 to 6 inches.

The silicon carbide single-crystal ingot may have a purity of at least 99%, at least 99.5%, or even at least 99.9%.

A seed crystal including a protective film 120 according to example embodiments includes a silicon carbide seed crystal 110 having a front surface 111 and a rear surface 112 and a protective film 120 located on the rear surface 112 of the silicon carbide seed crystal 110 wherein the protective film 120 includes a first layer 121 in direct contact with the rear surface of the silicon carbide seed crystal and a second layer 122 located on the first layer 121 and the first layer has a thickness corresponding to 30% or less of the thickness of the protective film from the bottom surface of the first layer to the top surface of the second layer.

The second layer 122 may include a larger amount of a filler than the first layer 121.

The first layer 121 may have a thickness of 15 μm or less.

The first layer 121 may include 1% by weight or less or 0.1% by weight or less of a carbonaceous or metallic filler, based on its total weight. The first layer 121 may be free of a carbonaceous or metallic filler.

The first layer 121 may have a thickness corresponding to 30% or less of the total thickness of the protective film.

The front surface of the silicon carbide seed crystal may be a C-plane (000-1).

The seed crystal may further include a silicon carbide ingot (not illustrated) located on the front surface 111 of the silicon carbide seed crystal.

The silicon carbide ingot may have a warpage of 500 μm or less.

The silicon carbide ingot may have a micropipe defect density of $1/cm^2$ or less.

The seed crystal including the protective film may be the same as that described in the preparation method and a further detailed description thereof is thus omitted to avoid duplication.

Figure 6:
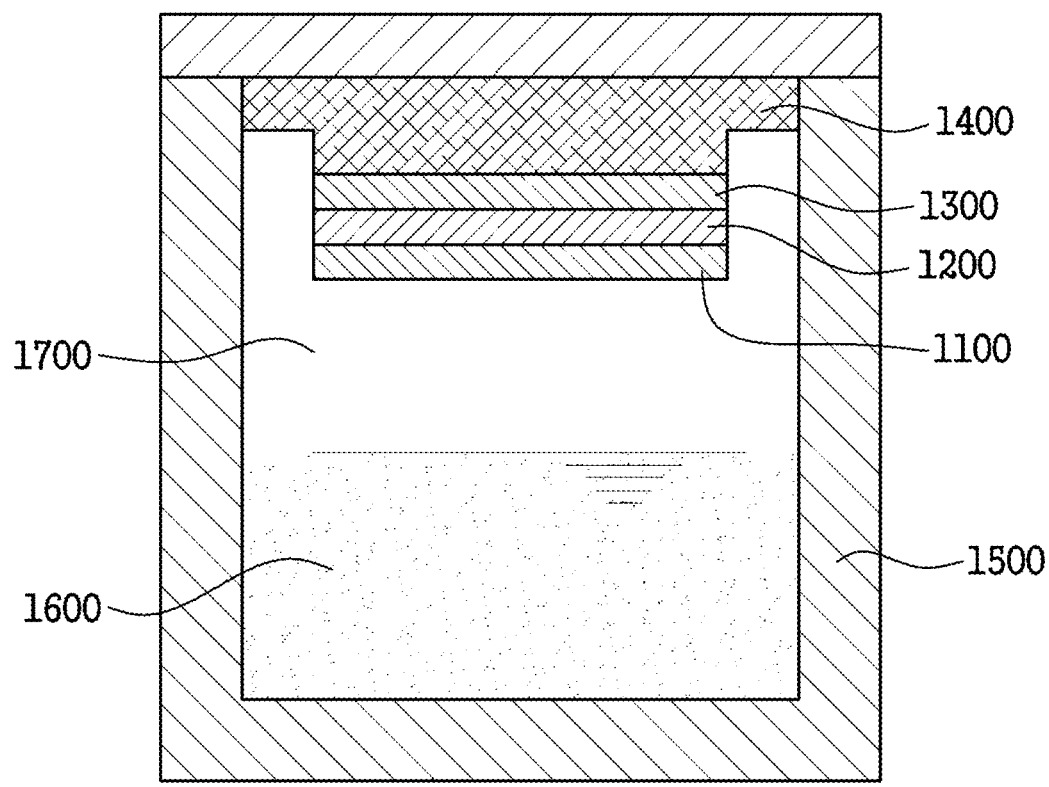
FIG. 6 is a cross-sectional view of a reactor for the growth of a SiC single-crystal ingot according to example embodiments.

FIG. 6 is a cross-sectional view of a reactor for the growth of a SiC single-crystal ingot according to example embodiments. As illustrated in FIG. 6, a seed crystal holder 1400 is mounted at the top inner end of the reactor, a seed crystal 1100 is attached to the underside of the seed crystal holder through a protective layer 1200 and an adhesive layer 1300, a raw material accommodating space 1600 is formed at the bottom inner end of the reactor, and an ingot growth space 1700 is formed in the upper portion of the reactor.

The reactor may be a crucible and may be made of a material having a melting point equal to or higher than the sublimation temperature of SiC. The material for the reactor may be, for example, graphite but is not limited thereto.

In a method for attaching a seed crystal according to example embodiments, a protective layer and an adhesive layer are formed on one surface of the seed crystal to suppress the formation of voids at the interface between the seed crystal and a seed crystal holder during growth of a SiC single-crystal ingot, with the result that the seed crystal can be prevented from being detached during growth of a SiC single-crystal ingot.

In addition, the method for attaching a seed crystal according to example embodiments can enhance the growth stability of a SiC single-crystal ingot, contributing to an improvement in the quality of the SiC single-crystal ingot and being advantageous in controlling the formation of polymorphs. That is, when 4H-SiC is used as the seed crystal, the growth of polymorphs such as 3C, 6H, and 15R can be suppressed and the growth stability of 4H can be enhanced.

According to one embodiment, the method for attaching a seed crystal includes the steps of (a) forming a protective layer on one surface of a seed crystal, (b) forming an adhesive layer on the protective layer, and (c) attaching the seed crystal to a seed crystal holder through the protective layer and the adhesive layer.

(a) Formation of Protective Layer on One Surface of Seed Crystal

According to one embodiment, the step (a) includes the substeps of (a-1) preparing a protective layer composition including a binder resin and a filler, (a-2) applying the protective layer composition to one surface of a seed crystal, and (a-3) heat treating the protective layer composition.

(a-1) Preparation of Protective Layer Composition Including Binder Resin and Filler.

In the substep (a-1), a protective layer composition including a binder resin and a filler is prepared.

The binder resin may be, for example, a phenolic resin, a polyacrylonitrile resin, a pitch resin, a polyvinyl chloride resin, a polyacrylic resin, a furan resin, an epoxy resin or a mixture thereof.

In one embodiment, the binder resin may have a high actual carbon ratio.

For example, the binder resin may have an actual carbon ratio of about 5% to about 50%, for example, 10% to 30%, as measured in an inert atmosphere.

The binder resin may be a curable resin. The binder resin may be, for example, a heat-curable resin but is not limited thereto.

The presence of the filler promotes carbonization of the protective layer composition and prevents excessive shrinkage to minimize the formation of cracks during heat treating of the protective layer composition.

The filler may be, for example, a carbonaceous filler, a metallic filler or a combination thereof. For example, the filler may include one or more components selected from crystalline graphite, amorphous graphite, expandable graphite, carbon black, carbon nanotubes, graphene, tantalum (Ta), tungsten (W), rhenium (Re), molybdenum (Mo), hafnium (Hf), tantalum carbide (TaC), and tungsten carbide (WC).

According to one embodiment, the binder resin and the filler may be present in amounts of about 50% by weight to about 70% by weight and about 5% by weight to about 30% by weight, respectively, based on the total weight of the protective layer composition.

For example, the binder resin may be present in an amount of 55% by weight to 70% by weight, 60% by weight to 70% by weight, or 65% by weight to 70% by weight, based on the total weight of the protective layer composition. This range is effective in maintaining the viscosity of the protective layer composition after coating, stabilizing the thickness of a protective layer formed after coating, and the actual carbon ratio of the binder resin upon graphitization.

For example, the filler may be present in an amount of 5% by weight to 25% by weight, 5% by weight to 20% by weight, 10% by weight to 25% by weight, or 20% by weight to 30% by weight, based on the total weight of the protective layer composition. This range is effective in preventing the occurrence of shrinkage and cracks to form a protective film with high surface quality.

The protective layer composition is a liquid composition, which is preferred for efficient coating.

Thus, the protective layer composition may further include a solvent. Examples of suitable solvents include ethanol, methanol, acetone, dimethylformamide (DMF), and dimethyl sulfoxide (DMSO). For example, the solvent may be ethanol but is not limited thereto.

The liquid composition may have a solid content of about 10% by weight to about 90% by weight, for example, 20% by weight to 50% by weight.

The protective layer composition may further include one or more additives in addition to the aforementioned components. Examples of the additives include wetting dispersants and defoamers.

(a-2) Application of the Protective Layer Composition to One Surface of Seed Crystal In the substep (a-2), the protective layer composition is applied to one surface of a seed crystal.

For example, the protective layer composition is applied to the upper surface of a seed crystal.

The protective layer composition may be applied to the upper surface of a seed crystal by a general coating technique such as spin coating or tape casting.

Herein, the "upper surface" of the seed crystal may refer to the surface of the seed crystal on which a single-crystal ingot does not grow. Herein, the "lower surface" of the seed crystal may refer to the surface of the seed crystal on which a single-crystal ingot grows. The lower surface of the seed crystal is generally wide and flat.

The crystal structure of the seed crystal may vary depending on the type of a crystal to be grown, such as 4H-SiC, 6H-SiC, 3C-SiC or 15R-SiC.

The seed crystal may be pre-cleaned before coating. A silicon dioxide film may be formed as a result of the reaction of silicon with oxygen on the surface of the seed crystal. The formation of the oxide film may cause detachment of the seed crystal or the formation of defects during growth of a single-crystal ingot in a subsequent process. Thus, it is preferred to remove the oxide film beforehand by cleaning.

The cleaning may be performed using a suitable fluid such as acetone, alcohol, distilled water or an acid solution. The cleaning may be performed by sonication or immersion, which can be repeated one or more times.

(a-3) Heat Treating of the Protective Layer Composition

According to one embodiment, the Heat treating (a-3) includes drying and curing the protective layer composition. The Heat treating (a-3) may further include carbonization or graphitization.

According to one embodiment, the drying may be performed in the temperature range of about 30° C. to about 350° C. and the curing may be performed in the temperature range of about 100° C. to about 400° C. For example, the drying and curing conditions are effective in not only forming a strong protective layer but also in forming an adhesive layer on the protective layer.

For example, the drying may be performed in the temperature range of 50° C. to 350° C. or 50° C. to 300° C. for about 1 hour to about 5 hours. For example, the curing may be performed in the temperature range of 100° C. to 400° C. or 150° C. to 400° C. for about 1 hour to about 10 hours.

According to one embodiment, the carbonization or graphitization may be performed at a temperature of about 200° C. to about 2,500° C. and a pressure of about 1 torr to about 1,500 torr. For example, high growth stability of a SiC single-crystal ingot can be achieved under the carbonization or graphitization conditions defined above, thus being advantageous in improving the quality of the SiC single-crystal ingot and controlling the formation of polymorphs.

After drying and curing, the protective layer composition may be carbonized or graphitized, for example, at a temperature of 1,500° C. to 2,500° C., 2,000° C. to 2,500° C., or 2,000° C. to 2,200° C. and a pressure of 500 torr to 1000 torr or 500 torr to 800 torr. The carbonization or graphitization may be performed for about 1 hour to about 10 hours, for example, 2 hours to 5 hours or 1 hour to 5 hours but is not limited thereto.

According to one embodiment, the carbonization or graphitization may be performed at a heating rate of about 0.5° C./min to about 5° C./min and at a temperature of 500° C. or higher or 600° C. or higher. For example, the carbonization or graphitization may be performed by raising the temperature to 500° C. to 1,000° C., maintaining the temperature during heating for 1 hour to 5 hours, and cooling at a rate of 0.5° C./min to 5° C./min.

According to a further embodiment, the carbonization or graphitization may be performed at a heating rate of 1° C./min to 5° C./min and at a temperature of 1,500° C. or higher or 2,000° C. or higher. For example, the carbonization or graphitization may be performed by raising the temperature to 1,500° C. to 2,500° C. or 2,000° C. to 2,500° C., maintaining the temperature during heating for 1 hour to 5 hours, and cooling at a rate of 1° C./min to 5° C./min.

According to one embodiment, the carbonization or graphitization may be performed by heat treating in an inert atmosphere. The inert atmosphere may be a nitrogen or argon atmosphere but is not limited thereto.

According to one embodiment, the protective layer may have a thickness of about 0.1 μm to about 2,000 μm. For example, the thickness of the protective layer may be in the range of 5 μm to 1,800 μm, 50 μm to 500 μm, 50 μm to 2,000 μm, or 20 μm to 1,500 μm but is not limited to this range. If the protective layer has a thickness smaller than the lower limit defined above, its role cannot be sufficiently expected. Meanwhile, if the protective layer has a thickness larger than the upper limit defined above, cracks may be formed and peel off may occur.

(b) Formation of Adhesive Layer on the Protective Layer

According to one embodiment, the step (b) includes the substeps of (b-1) preparing an adhesive layer composition including a binder resin and a filler and (b-2) applying the adhesive layer composition onto the protective layer.

(b-1) Preparation of Adhesive Layer Composition Including Binder Resin and Filler In the substep (b-1), an adhesive layer composition including a binder resin and a filler is prepared.

The binder resin may be, for example, a phenolic resin, a polyacrylonitrile resin, a pitch resin, a polyvinyl chloride resin, a polyacrylic resin, a furan resin, an epoxy resin or a mixture thereof.

In one embodiment, the binder resin may have a high actual carbon ratio.

For example, the binder resin may have an actual carbon ratio of about 5% to about 50%, for example, 10% to 30%, as measured in an inert atmosphere.

The binder resin may be a curable resin. The binder resin may be, for example, a heat-curable resin but is not limited thereto.

The filler may be a carbonaceous filler, a metallic filler or a combination thereof. For example, the filler may include one or more components selected from crystalline graphite, amorphous graphite, expandable graphite, carbon black, carbon nanotubes, graphene, tantalum (Ta), tungsten (W), rhenium (Re), molybdenum (Mo), hafnium (Hf), tantalum carbide (TaC), and tungsten carbide (WC).

According to one embodiment, the binder resin and the filler may be present in amounts of about 70% by weight to about 90% by weight and about 20% by weight to about 40% by weight, respectively, based on the total weight of the adhesive layer composition.

For example, the binder resin may be present in an amount of 75% by weight to 90% by weight, 80% by weight to 90% by weight, or 80% by weight to 85% by weight, based on the total weight of the adhesive layer composition. This range is effective in improving the adhesive strength of the adhesive layer composition, maintaining the viscosity of the adhesive layer composition after coating, and stabilizing the thickness of an adhesive layer formed after coating.

For example, the filler may be present in an amount of 20% by weight to 35% by weight, 20% by weight to 30% by weight, or 20% by weight to 25% by weight, based on the total weight of the adhesive layer composition.

Within this range, the occurrence of shrinkage and cracks can be effectively prevented.

The adhesive layer composition is a liquid composition, which may be efficient for coating.

Thus, the adhesive layer composition may further include a solvent. Examples of suitable solvents include ethanol, methanol, acetone, dimethylformamide (DMF), and dimethyl sulfoxide (DMSO). For example, the solvent may be ethanol but is not limited thereto.

The liquid composition may have a solid content of about 10% by weight to about 90% by weight, for example 20% by weight to 50% by weight.

The adhesive layer composition may further include one or more additives in addition to the aforementioned components. Examples of the additives include wetting dispersants and defoamers.

(b-2) Application of the Adhesive Layer Composition onto the Protective Layer.

In the substep (b-2), the adhesive layer composition is applied onto the protective layer to form an adhesive layer.

The substep (b-2) may be carried out by a general coating technique, such as spin coating or tape casting.

According to one embodiment, the adhesive layer may have a thickness of about 5 µm to about 2,000 µm. For example, the thickness of the adhesive layer may be in the range of 50 µm to 1,000 µm, 100 µm to 2,000 µm, 100 µm to 1,000 µm, or 200 µm to 500 µm but is not limited thereto. Within this range, the coefficient of thermal expansion of the seed crystal can be controlled to be close to that of a seed crystal holder.

According to one embodiment, the method may further include a step of patterning the lower surface of a seed crystal holder prior to the step (c). According to one embodiment, the method may further include the step of patterning the lower surface of a seed crystal holder after the step (b) and prior to the step (c). This patterning may be performed using a grinder but is not limited thereto.

In example embodiments, the lower surface of the seed crystal holder refers to the surface of the seed crystal holder to which the adhesive layer is attached. For example, the patterning of the lower surface of the seed crystal holder can suppress the formation of voids at the interface between the adhesive layer and the seed crystal holder during growth of a SiC single-crystal ingot to prevent the seed crystal from being detached during growth of a SiC single-crystal ingot.

According to one embodiment, the patterned seed crystal holder may have a surface roughness (Ra) of about 0.5 mm to about 3 mm.

(c) Attachment of the Seed Crystal to Seed Crystal Holder Through the Protective Layer and the Adhesive Layer In the step (c), the seed crystal is attached to a seed crystal holder through the protective layer and the adhesive layer. For example, the protective layer and the adhesive layer are formed in this order on the upper surface of the seed crystal, and the adhesive layer is attached to the lower surface of the seed crystal holder.

According to one embodiment, the method may further include the step of carbonizing or graphitizing the adhesive layer or both the adhesive layer and the protective layer after the step (c).

According to one embodiment, the carbonization or graphitization may be performed at a temperature of about 200° C. to about 2,500° C. and a pressure of about 1 torr to about 1,500 torr. For example, high growth stability of a SiC single-crystal ingot can be achieved under the carbonization or graphitization conditions defined above, thus being advantageous in improving the quality of the SiC single-crystal ingot and controlling the formation of polymorphs.

For example, the carbonization or graphitization may be performed at a temperature of 1,500° C. to 2,500° C., 2,000° C. to 2,500° C., or 2,000 to 2,200° C. and a pressure of 500 torr to 1000 torr or 500 torr to 800 torr. The carbonization or graphitization may be performed for about 1 hour to about 10 hours, for example, 2 hours to 5 hours or 1 hour to 5 hours, but is not limited thereto.

According to one embodiment, the carbonization or graphitization may be performed at a heating rate of about 0.5° C./min to about 5° C./min and at a temperature of 500° C. or higher or 600° C. or higher. For example, the carbonization or graphitization may be performed by raising the temperature to 500° C. to 1,000° C., maintaining the temperature during heating for 1 hour to 5 hours, and cooling at a rate of about 0.5° C./min to about 5° C./min.

According to a further embodiment, the carbonization or graphitization may be performed at a heating rate of 1° C./min to 5° C./min and at a temperature of 1,500° C. or higher or 2,000° C. or higher. For example, the carbonization or graphitization may be performed by raising the temperature to 1,500° C. to 2,500° C. or 2,000° C. to 2,500°

C., maintaining the temperature during heating for 1 hour to 5 hours, and cooling at a rate of 1° C./min to 5° C./min.

According to one embodiment, the carbonization or graphitization may be performed by heat treating in an inert atmosphere. The inert atmosphere may be a nitrogen or argon atmosphere but is not limited thereto.

According to one embodiment, the density of the carbonized or graphitized protective layer may be higher than that of the carbonized or graphitized adhesive layer. For example, when the density of the carbonized or graphitized protective layer is higher than that of the carbonized or graphitized adhesive layer, the stability of the protective layer and the adhesive layer can be improved. For example, the density of the carbonized or graphitized protective layer may be about 1.0 g/cm$^3$ to about 2.0 g/cm$^3$, for example, 1.5 g/cm$^3$ to 2.0 g/cm$^3$ and the density of the carbonized or graphitized adhesive layer may be about 0.5 g/cm$^3$ to about 1.5 g/cm$^3$, for example, 1.0 g/cm$^3$ to 1.5 g/cm$^3$.

Example embodiments will be explained in more detail with reference to the following examples. However, these examples are merely illustrative to assist in understanding example embodiments and are not intended to limit the scope of example embodiments.

Production Example 1

Example 1: Preparation of Seed Crystal Including Protective Film According to Example Embodiments 1) Preparation of First Layer Composition and Second Layer Composition A phenolic resin (KC-5536, Kangnam Chemical Co. Ltd., hereinafter the same applied) as a binder resin was diluted with ethanol (OCI, hereinafter the same applied) as a solvent to prepare a first layer composition having a solid content of ~10 wt %.

The binder resin was diluted with the solvent until a solid content of ~10 wt % was reached. Thereafter, the dilution was mixed with a filler (crystalline graphite, purity 80-99%, $D_{50}$ 2.5 μm, hereinafter the same applied). The filler was used in an amount of ~90 parts by weight, based on 100 parts by weight of the binder resin. The resulting mixture was mixed with 5 parts by weight of additives, including a wetting dispersant and a defoamer, and dispersed to obtain a second layer composition.

2) Formation of First Layer

The first layer composition was spin coated on the rear surface (opposite to the growth surface) of a 4-inch sized silicon carbide seed crystal (crystal structure 4H-SiC) to form a 5 μm thick first coating layer. The silicon carbide seed crystal on which the first coating layer was formed was put into an oven, heated to 300° C. at a rate of 10° C./min, heat treated for 1 h, and cooled at a rate of 10° C./min. As a result, a first layer was formed on the rear surface of the silicon carbide seed crystal.

3) Formation of Second Layer

The second layer composition was spin coated on the first layer of the silicon carbide seed crystal to form a 12 μm thick second coating layer. The silicon carbide seed crystal on which the first layer and the second coating layer were sequentially formed was put into an oven, heated to 600° C. at a rate of 1° C./min, and heat treated for 2 h. As a result of the heat treating, the second coating layer was carbonized to form a second layer. Subsequent cooling at a rate of 1° C./min gave a seed crystal including the first layer and second layer formed in this order on the rear surface of the silicon carbide seed crystal.

3) Formation of Additional Carbon Layer

The second layer composition was spin coated on the second layer of the seed crystal prepared in 2) in which the first layer and the second layer were formed in this order on the rear surface of the silicon carbide seed crystal, followed by heat treating to form an additional carbon layer. The resulting coated seed crystal had a structure in which the first layer, the second layer, and the additional carbon layer were sequentially formed on the rear surface of the silicon carbide seed crystal.

The total thickness of the coating layer of the coated seed crystal was 23 μm.

Comparative Example 1: Preparation of Seed Crystal without Protective Film of Example Embodiments The second layer composition was spin coated on the rear surface of the silicon carbide seed crystal to obtain a second coating layer. The silicon carbide seed crystal on which the second coating layer was formed was put into an oven, heated to 600° C. at a rate of 1° C./min, and heat treated for 2 h. As a result of the heat treating, the second coating layer was carbonized to form a second layer.

This procedure was repeated twice more to form three carbonized second layers on the rear surface of the silicon carbide seed crystal. As a result, a seed crystal including the 30 μm thick carbonized layer was prepared.

Production of Silicon Carbide Ingot

A rack 250 was mounted in the upper portion of the inner wall of a graphite crucible 200 (reactor), whose structure is schematically illustrated in FIG. 2.

A SiC powder (purity=99.99%, $D_{50}$ 100 μm) as a raw material 300 was loaded into the lower portion of a crucible body 210. Before mounting the rack 250 in the upper portion of the crucible body 210, the seed crystal 110 having the protective film 120 on the rear surface of the silicon carbide seed crystal (Production Example 1) was placed on the rack 250.

The seed crystal was placed on the rack without using any adhesive. The rear surface of the silicon carbide seed crystal (the surface in contact with the protective film) was directed toward the top of the crucible and the growth surface of the silicon carbide seed crystal (the surface without the protective film) was directed toward the bottom of the crucible.

The crucible body 210 in which the seed crystal and the rack 250 were provided was covered with a cover 220, surrounded by a heat insulating material 400, and put into a reaction chamber 420 provided with a heating coil as heating means 500 (see FIG. 4). The crucible was evacuated, argon gas was slowly introduced into the crucible until the internal pressure of the crucible 200 reached atmospheric pressure, and the internal pressure of the crucible 200 was slowly reduced again. Simultaneously with the pressure reduction, the internal temperature of the crucible 200 was slowly raised to 2300° C.

A SiC single-crystal ingot was grown on the protective film-free surface of the silicon carbide seed crystal at a temperature of 2300° C. and a pressure of 20 torr for 100 h.

Figure 5:
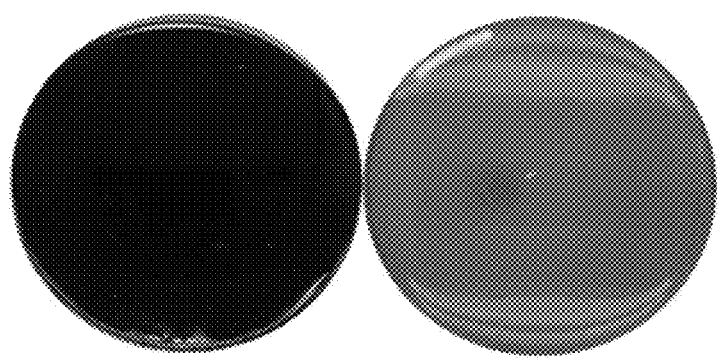
FIG. 5 shows real images of ingots produced in (a) Example 1 and (b) Comparative Example 1 of Production Example 1.
Figure 5:
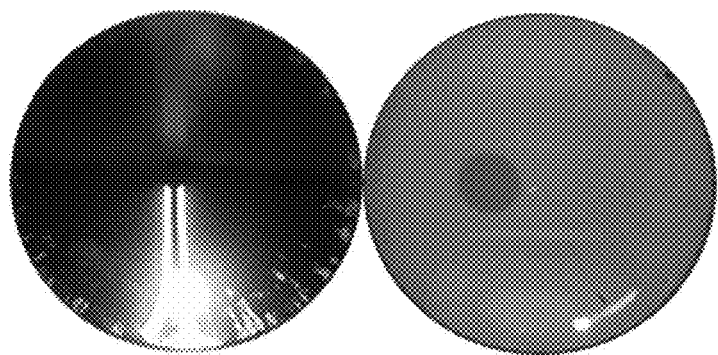

Images of the grown ingot are shown in FIG. 5.

Test Example 1: Characterization of the Single-Crystal Ingots

The ingots produced in Example 1 and Comparative Example 1 of Production Example 1 were evaluated for physical properties. The thicknesses of the coating layers, the degrees of surface peel off, and the warpages of the ingots are shown in Table 1.

Degree of surface peel off was defined as the ratio of the area of the detached portion of the coating layer to the total area of the coating layer.

Micropipe defects (MPD) were counted per unit area at etched surface of the ingot under an optical microscope using molten KOH etching.

Warpage was determined by measuring the heights of the ingot from the rear surface of the ingot to the front surface of the ingot at the center and edge of the ingot and calculating the height difference. The heights of the ingot were measured using a height gauge after the ingot was placed on a platen.

film, and cooled at a rate of 1° C./min to obtain a seed crystal having a protective layer formed on one surface of the silicon carbide seed crystal.

The liquid phenolic resin was mixed with the crystalline graphite as a filler in a weight ratio of 8:2 and 100 parts by weight of the mixture was mixed with 3 parts by weight of additives, including a wetting dispersant and a defoamer. The resulting mixture was dispersed to obtain an adhesive layer composition. The adhesive layer composition was spin coated on the protective layer of the seed crystal to obtain a 0.5 mm thick adhesive layer.

Attachment of the Seed Crystal to the Seed Crystal Holder

The lower surface of the seed crystal holder was patterned with a grinder and the adhesive layer of the seed crystal was attached to the patterned lower surface of the seed crystal

TABLE 1

| Production Example 1 | Thickness of first layer [μm] | Thickness of second layer [μm] | Total thickness of protective film [μm] | Proportion of thickness of first layer (%) | Surface peel off | MPD* [/cm$^2$] | Warpage [μm] |
|---|---|---|---|---|---|---|---|
| Example 1 | 3 | 10 + 10** | ~23 | 13.04*** | Not observed | ≤1 | 93 |
| Comparative Example 1 | — | 10 + 10 + 10** | ~30 | — | Not observed | ≤5 | 140 |

*MPD: Micropipe defects
**The thickness of the second layer formed by repeated coating and heat treating of the same composition. The thicknesses of the heat treated coatings were separated by plus signs (+).
***The proportion of the thickness of the first layer relative to the thickness of the protective film from the bottom surface of the first layer to the top surface of the second layer Referring to the results in Table 1, the significantly low warpage of the ingot of Example 1 of Production Example 1 demonstrates that the use of the protective film including the first layer and the second layer according to example embodiments ensures a significant reduction in the number of defects in the single-crystal ingot while minimizing thermal shrinkage of the protective film, as described above.

Production Example 2

Example 1

Components used in Example 1 and Comparative Example 1 of Production Example 2 are as follows:

Liquid phenolic resin: phenolic resin/methyl alcohol/water=58-62:36-41:0-4 (weight ratio), Neolite KC-4703, Kangnam Chemical Co. Ltd.

Crystalline graphite: Average particle size ($D_{50}$)=2.5 μm

Silicon carbide seed crystal: Diameter=4-6 inches, thickness=500-1200 μm, crystal structure=4H single crystal substrate Seed crystal holder: Diameter=7 inches, thickness=5-10 mm Preparation of Seed Crystal with Protective Layer and Adhesive Layer The liquid phenolic resin was mixed with the crystalline graphite as a filler in a weight ratio of 7:3 and 100 parts by weight of the mixture was mixed with 3 parts by weight of additives, including a wetting dispersant and a defoamer. The resulting mixture was dispersed to obtain a protective layer composition. The protective layer composition was spin coated on one surface of the silicon carbide seed crystal to form a 0.5 mm thick coating film. The coated seed crystal was put into a heater, heated to 600° C. at a rate of 1° C./min, heat treated for 2 h to carbonize or graphitize the coating holder. The seed crystal holder attached with the seed crystal was put into a heater, heated to 600° C. at a rate of 1° C./min, heat treated for 2 h for carbonization or graphitization, and cooled at a rate of 1° C./min.

Growth of Single-Crystal Ingot

The seed crystal holder attached with the seed crystal was mounted on the top inner end of a graphite crucible and a SiC powder was loaded into the lower portion of the crucible. The crucible surrounded by a heat insulating material was put into a reaction chamber provided with a heating coil. The crucible was evacuated and argon gas was slowly introduced into the crucible. Simultaneously with this, the temperature and pressure of the crucible were raised to 2400° C. and 700 torr, respectively. Thereafter, the pressure was gradually lowered to 30 torr. Under the above conditions, a SiC single-crystal ingot was allowed to grow on the seed crystal for 50 h to produce the SiC single-crystal ingot in Example 1 of Production Example 2.

Comparative Example 1

A SiC single-crystal ingot was produced in the same manner as in Example 1 of Production Example 2, except that the protective layer was not formed on the silicon carbide seed crystal.

Evaluation Example 1: Evaluation of Surface Images of the Ingots

The surfaces of the SiC single-crystal ingots produced in Example 1 and Comparative Example 1 of Production Example 2 were visually observed with an optical microscope.

Figure 7:
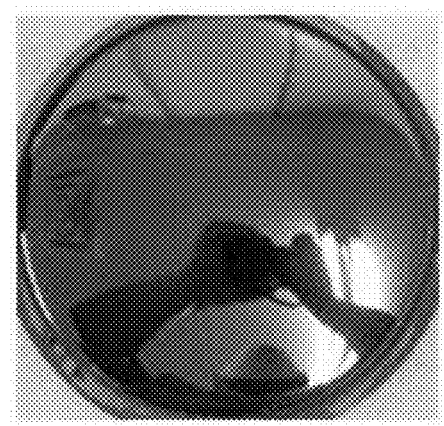
FIG. 7 is a surface image of a SiC single-crystal ingot produced in Example 1 of Production Example 2.
Figure 10:
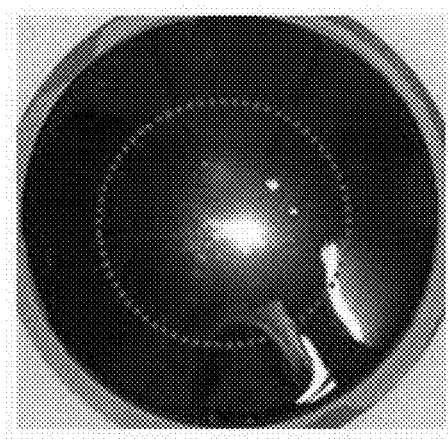
FIG. 10 is a surface image of a SiC single-crystal ingot produced in Comparative Example 1 of Production Example 2.

FIGS. 7 and 10 are surface images of the SiC single-crystal ingots produced in Example 1 and Comparative Example 1 of Production Example 2, respectively.

As shown in FIG. 7, since the silicon carbide seed crystal was strongly attached to the seed crystal holder, the SiC single-crystal ingot produced in Example 1 of Production Example 2 was stably grown without detachment of the silicon carbide seed crystal, leaving no impurities or foreign matter on the surface. In contrast, the SiC single-crystal ingot of Comparative Example 1 of Production Example 2 was not stably grown because of the weak attachment of the silicon carbide seed crystal to the seed crystal holder, with the result that impurities or foreign matter was observed on the surface, particularly the surface of the central portion of the ingot, as shown in FIG. 10.

Evaluation Example 2: Evaluation of UV Images

UV images of the SiC single-crystal ingots produced in Example 1 and Comparative Example 1 of Production Example 2 were visually evaluated under UV lamp irradiation.

Figure 8:
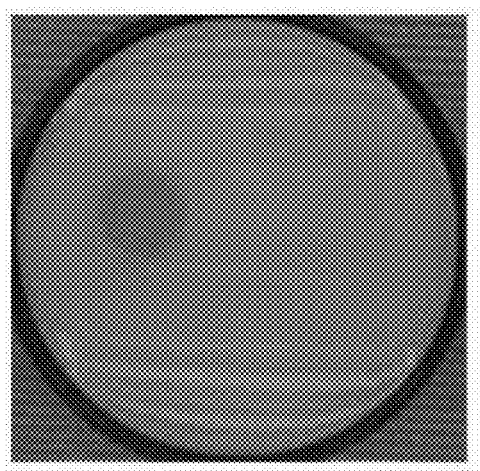
FIG. 8 is a UV image of a SiC single-crystal ingot produced in Example 1 of Production Example 2.
Figure 11:
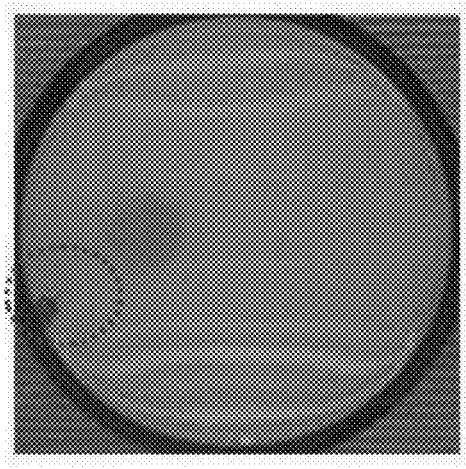
FIG. 11 is a UV image of a SiC single-crystal ingot produced in Comparative Example 1 of Production Example 2.

FIGS. 8 and 11 are UV images of the SiC single-crystal ingots produced in Example 1 and Comparative Example 1 of Production Example 2, respectively. These UV images reveal control over the formation of polymorphs. For example, desired 4H was uniformly formed in the SiC single-crystal ingot of Example 1 of Production Example 2, as shown in FIG. 8. In contrast, polycrystals were formed in the SiC single-crystal ingot of Comparative Example 1 of Production Example 2, as shown at the left side (indicated by the dashed circle) of FIG. 11.

Evaluation Example 3: Evaluation of Surface Images of the Seed Crystals

The surfaces of the seed crystals after growth of the SiC single-crystal ingots in Example 1 and Comparative Example 1 of Production Example 2 were visually observed under an optical microscope.

Figure 9:
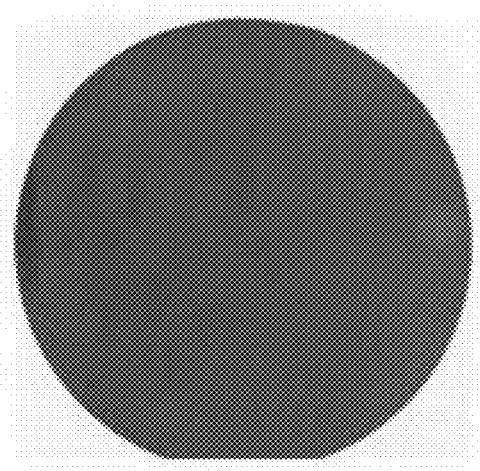
FIG. 9 is a surface image of a seed crystal after growth of a SiC single-crystal ingot in Example 1 of Production Example 2.
Figure 12:
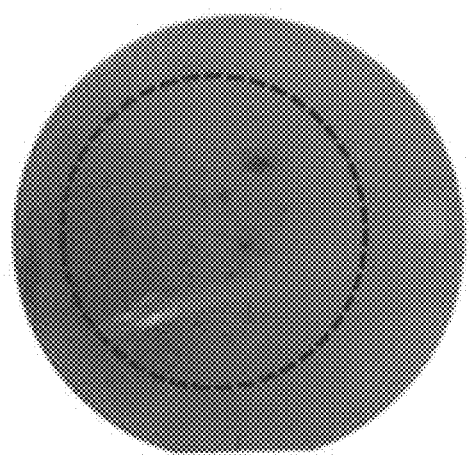
FIG. 12 is a surface image of a seed crystal after growth of a SiC single-crystal ingot in Comparative Example 1 of Production Example 2.

FIGS. 9 and 12 are surface images of the seed crystals after growth of the SiC single-crystal ingots in Example 1 and Comparative Example 1 of Production Example 2, respectively.

As shown in FIG. 9, no defects were observed on the surface of the seed crystal from which the SiC single-crystal ingot was grown in Example 1 of Production Example 2. That is, since the silicon carbide seed crystal was strongly attached to the seed crystal holder, the SiC single-crystal ingot produced in Example 1 of Production Example 2 was stably grown without detachment of the silicon carbide seed crystal. In contrast, defects were observed on the surface of the seed crystal from which the SiC single-crystal ingot was grown in Comparative Example 1 of Production Example 2. That is, the ingot of Comparative Example 1 of Production Example 2 was not stably grown because of the weak attachment of the silicon carbide seed crystal to the seed crystal holder.

The seed crystal including a protective film according to example embodiments can be prepared in a relatively simple manner and the use of the seed crystal enables the production of a single-crystal silicon carbide ingot with fewer defects, particularly a silicon carbide ingot with less warpage.

In addition, the formation of the carbonaceous protective film on the rear surface of the seed crystal can prevent possible loss of the rear surface of the seed crystal during subsequent heating for growth. Particularly, the constituent layers of the multilayer carbonaceous protective film are designed to have different physical properties. Due to this design, the multilayer protective film has improved physical properties in terms of quality, adhesion to the seed crystal, and thickness compared to a monolayer protective film. Therefore, possible stress during growth of a single-crystal ingot is more effectively suppressed so that the quality of the ingot can be prevented from deterioration resulting from defects, for example, cracks.

The method for attaching a seed crystal according to example embodiments can suppress the formation of voids at the interface between the seed crystal and a seed crystal holder during growth of a SiC single-crystal ingot. Therefore, the seed crystal can be prevented from being detached during growth of a SiC single-crystal ingot. In addition, the growth stability of a SiC single-crystal ingot can be enhanced, contributing to an improvement in the quality of the SiC single-crystal ingot.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A seed crystal comprising a protective film, comprising:
a silicon carbide seed crystal comprising a front surface and a rear surface; and a protective film located on the rear surface of the silicon carbide seed crystal,
wherein the protective film comprises:
a first layer comprising a first filler and a first binder resin and in direct contact with the rear surface of the silicon carbide seed crystal;
a second layer comprising a second binder, a graphitization product of the second binder, and a second filler, and disposed on the first layer; and
a third layer comprising a third filler and a third binder resin, and disposed on the second layer,
wherein the first layer has a thickness corresponding to 30% or less of the thickness of the protective film from the bottom surface of the first layer to the top surface of the second layer,
wherein the first layer comprises 1% by weight or less of a carbonaceous or metallic filler as the first filler, based on a total weight of the first layer,
wherein the first binder resin and the third binder resin are selected from the group consisting of a polyacrylonitrile resin, a pitch resin, a polyvinyl chloride resin, a polyacrylic resin, a furan resin, an epoxy resin, and a mixture thereof, respectively.

2. The seed crystal according to claim 1, wherein an amount of the second filler is greater than an amount of the first filler.

3. The seed crystal according to claim 1, further comprising a silicon carbide ingot located on the front surface of the silicon carbide seed crystal and comprising a warpage of 500 µm or less.

4. The seed crystal according to claim 1, further comprising a silicon carbide ingot located on the front surface of the silicon carbide seed crystal and comprising a micropipe defect density of $1/cm^2$ or less.

5. A method for attaching the seed crystal of claim 1, comprising the steps of:
   (a) forming the protective layer on one surface of the seed crystal;
   (b) forming an adhesive layer on the protective layer; and
   (c) attaching the seed crystal to a seed crystal holder through the protective layer and the adhesive layer, wherein the step (a) comprises substeps of:
      (a-1) preparing a first protective layer composition comprising the first binder resin and the first filler, a second protective layer composition comprising the second binder resin and the second filler, and a third protective layer composition comprising the third binder resin and the third filler;
      (a-2) applying the first protective layer composition to the one surface of the seed crystal and heat treating the first protective layer composition to form the first layer;
      (a-3) applying the second protective layer composition onto the first layer and heat treating the second protective layer composition to form the second layer; and
      (a-4) applying the third protective layer composition onto the second layer and heat treating the third protective layer composition to form the third layer.

6. The method according to claim 5, wherein the heat treating the first protective layer composition, the second protective layer composition, and the third protective layer composition comprises drying, curing, and carbonizing or graphitizing the first protective layer composition, the second protective composition, and the third protective composition.

7. The method according to claim 5, further comprising a step of patterning a lower surface of the seed crystal holder prior to the step (c), wherein the patterned seed crystal holder comprises a surface roughness (Ra) of about 0.5 mm to about 3 mm.

8. The method according to claim 7, wherein the lower surface of the seed crystal holder is patterned after the step (b).

9. The method according to claim 5, wherein the protective layer comprises a greater density than the adhesive layer.

10. A method for preparing the seed crystal comprising the protective film of claim 1, comprising the steps of:
   preparing i) a first layer composition comprising the first binder resin, the first filler, and a first solvent, ii) a second layer composition comprising the second binder resin, the second filler, and a second solvent, and iii) a third layer composition comprising the third binder resin, the third filler, and a third solvent;
   applying the first layer composition to the rear surface of the seed crystal and drying the first layer composition to form the first layer on the rear surface of the seed crystal;
   applying the second layer composition onto the first layer and drying the second layer composition to form the second layer on the first layer; and
   applying the third layer composition onto the second layer and drying the third layer composition to form the third layer on the second layer,
   wherein the first layer, the second layer, and the third layer are sequentially disposed on the rear surface of the seed crystal.

11. The method according to claim 10, wherein the second layer composition comprises 20 to 300 parts by weight of the second filler, in terms of a solid content, based on 100 parts by weight of the second binder resin.

12. The method according to claim 10, wherein the first layer comprises a thickness of 20 µm or less.

* * * * *